(12) United States Patent
Ohshima (10) Patent No.: US 7,443,645 B2
(45) Date of Patent: Oct. 28, 2008

(54) OVERCURRENT DETECTING DEVICE

(75) Inventor: Shunzou Ohshima, Toyota (JP)

(73) Assignee: Yazaki Corporation, Tokyo (JP)

( * ) Notice: Subject to any disclaimer, the term of this patent is extended or adjusted under 35 U.S.C. 154(b) by 333 days.

(21) Appl. No.: 11/357,101

(22) Filed: Feb. 21, 2006

(65) Prior Publication Data

US 2006/0187604 A1 Aug. 24, 2006

(30) Foreign Application Priority Data

Feb. 21, 2005 (JP) ............ P2005-044398

(51) Int. Cl.
*H02H 3/18* (2006.01)
*H02H 3/00* (2006.01)
(52) U.S. Cl. .................... 361/79; 361/93.1
(58) Field of Classification Search .......... 361/79, 361/93.1
See application file for complete search history.

(56) References Cited

U.S. PATENT DOCUMENTS

| | | | | |
|---|---|---|---|---|
| 4,951,250 | A * | 8/1990 | Cruickshank et al. | 710/12 |
| 5,485,341 | A * | 1/1996 | Okado et al. | 361/98 |
| 5,629,542 | A * | 5/1997 | Sakamoto et al. | 257/328 |
| 5,929,593 | A * | 7/1999 | Eguchi | 320/139 |
| 6,222,366 | B1 * | 4/2001 | Dilger | 324/319 |
| 6,335,577 | B1 * | 1/2002 | Baba | 307/28 |
| 6,369,556 | B1 * | 4/2002 | Ohshima | 323/282 |
| 6,377,428 | B1 * | 4/2002 | Ogasawara | 361/86 |
| 2001/0010458 | A1 * | 8/2001 | Ohshima | 323/282 |
| 2005/0024900 | A1 * | 2/2005 | Hachiya | 363/24 |

FOREIGN PATENT DOCUMENTS

| | | | |
|---|---|---|---|
| JP | 9-275629 | A | 10/1997 |
| JP | 2000-312142 | A | 11/2000 |
| JP | 2001-238350 | A | 8/2001 |
| JP | 2002-111465 | A | 4/2002 |
| JP | 2003-219635 | A | 7/2003 |
| KR | 10-1997-0055020 | A | 7/1997 |
| WO | 02/097940 | A2 | 12/2002 |

OTHER PUBLICATIONS

Korean Office Action date Dec. 26, 2007 for Application No. 10-2006-0016146.

* cited by examiner

*Primary Examiner*—Ronald W Leja
(74) *Attorney, Agent, or Firm*—Sughrue Mion, PLLC (57) ABSTRACT

An overcurrent detecting device for detecting an overcurrent in a load circuit for controlling ON/OFF of a load by using a semiconductor switch, includes a driver circuit that outputs a driving signal to the semiconductor switch, a reference voltage generating circuit that generates a reference voltage, a measured voltage generating circuit that generates a measured voltage corresponding to a voltage generated across the semiconductor switch, a first comparator that compares the measured voltage with the reference voltage and outputs an overcurrent determination signal when the measured voltage is greater than the reference voltage, a saturation determining circuit that determines that a differential voltage between a control voltage of the semiconductor switch and a voltage to be applied to a positive side of the semiconductor switch is greater than a predetermined voltage, and an overcurrent signal switching circuit that performs a switching operation so as to enable the overcurrent determination signal to be output to the driver circuit when the saturation determining circuit determines that the differential voltage is greater than the predetermined voltage.

4 Claims, 5 Drawing Sheets

OVERCURRENT DETECTING DEVICE

BACKGROUND OF THE INVENTION

The present invention relates to an overcurrent detecting device for detecting an overcurrent flowing to a DC circuit and more particularly to a technique for setting a mask time of a detection of an overcurrent in a transient state to be short.

For example, in a DC circuit in which a semiconductor switch such as an FET is provided between a DC power supply and a load such as a motor or a lamp and is turned ON/OFF to control a driving operation of the load, there is provided an overcurrent detecting circuit for detecting an overcurrent such as a short-circuit current when it flows. When the overcurrent is detected, the semiconductor switch is broken instantly to protect the circuit.

Figure 5:
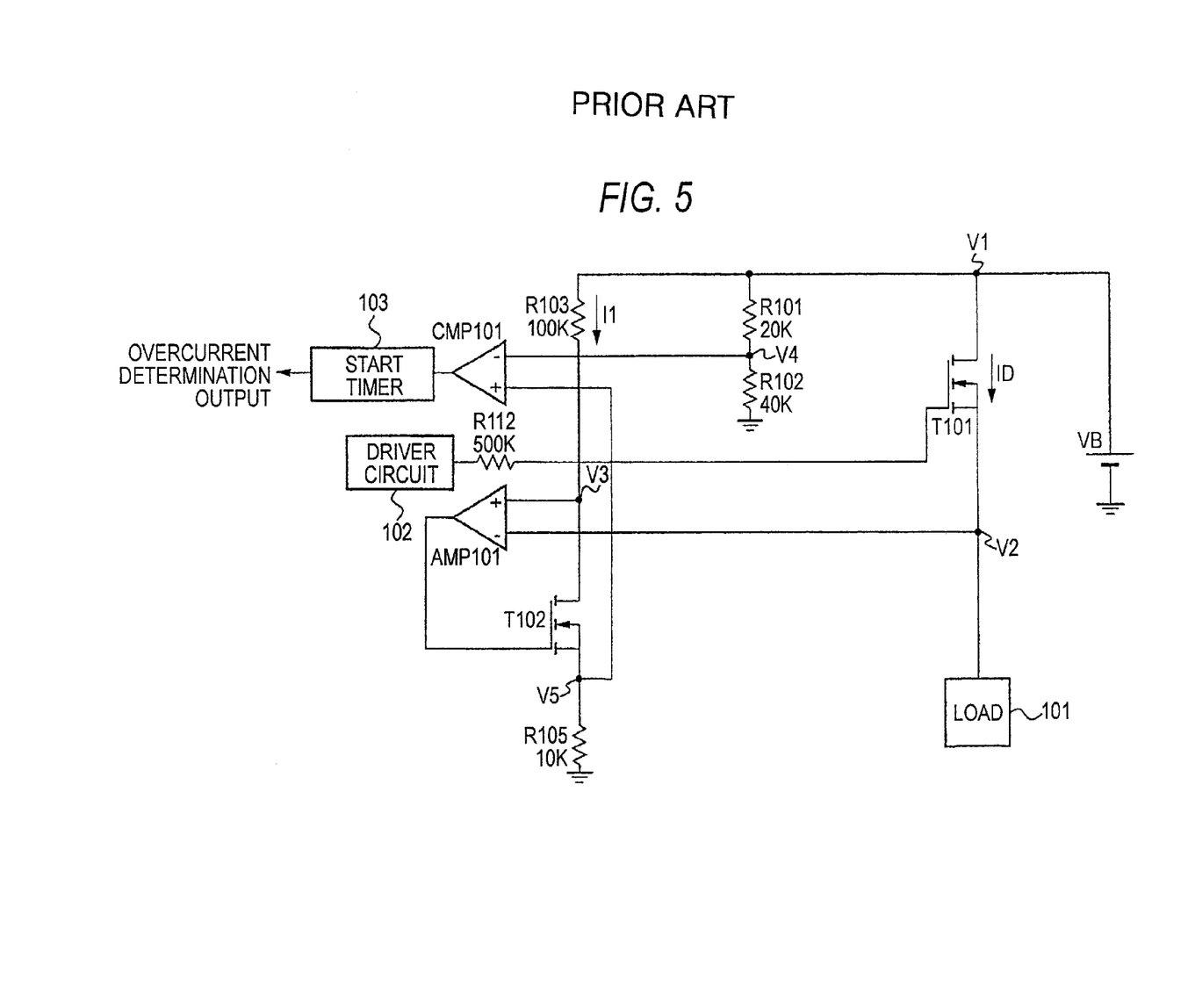
FIG. 5 is a circuit diagram showing a structure of a conventional overcurrent detecting device.

FIG. 5 is a circuit diagram showing a structure of a load driving circuit mounting an overcurrent detecting circuit according to the related art. A DC power supply VB shown in FIG. 5 is a battery to be mounted on a vehicle, for example, and a load 101 is a motor for power window driving or various lamps which is/are to be mounted on the vehicle, for example. The DC power supply VB and the load 101 are connected to each other through an FET (T101) of an MOS type.

Moreover, an output terminal on a positive side of the DC power supply VB is set to have a voltage V1 and is grounded through a series connecting circuit including resistors R101 and R102. Accordingly, a voltage V4 of a node of the resistors R101 and R102 is obtained by dividing the voltage V1 through the resistors R101 and R102. The voltage V4 is supplied to an input terminal on a negative side of a comparator (CMP101).

Furthermore, the output terminal on the positive side of the DC power supply VB is grounded through a series connecting circuit including a resistor R103, an FET (T102) and a resistor R105, a node (a voltage V3) of the resistor R103 and the FET (T102) is connected to an input terminal on a positive side of an amplifier (AMP101), an input terminal on a negative side of the amplifier (AMP101) is connected to a source (a voltage V2) of the FET (T101), and an output terminal of the amplifier (AMP101) is connected to a gate of the FET (T102).

Moreover, a source (a voltage V5) of the FET (T102) is connected to the input terminal on a positive side of the comparator (CMP101).

Furthermore, a driver circuit 102 for driving the FET (T101) is provided. The driver circuit 102 is connected to a gate of the FET (T101) through a resistor R112. A numeric value described under each designation, for example, "20 K" described under the resistor R101 indicates that an example of a resistance value of the resistor R101 is 20 KΩ.

When the FET (T101) is turned ON, a voltage VDS between the drain and the source of the FET (T101) can be expressed in the following equation (1), wherein an ON-state resistance of the FET (T101) is represented by Ron and a drain current is represented by ID.

$$VDS = V1 - V2 = Ron * ID \quad (1)$$

The amplifier (AMP101) outputs a control signal to the gate of the FET (T102) corresponding to a difference between the voltage VDS and a voltage generated on the resistor R103 and controls a current I1 flowing to a series circuit constituted by the resistor R103, T102 and R105. Consequently, a voltage generated on both ends of the resistor R103 is controlled to be equal to the voltage VDS between the drain and the source.

For example, furthermore, if a resistance value of a resistor R105 is set to have a magnitude which is 100 times as great as a resistance value of the resistor R103 (for example, R103=100Ω and R105=10 KΩ), the voltage V5 is obtained by amplifying the voltage VDS to be 100 times as great. This can be expressed in the following equation (2).

$$V5 = (R105/R103) * VDS \quad (2)$$
$$= (R105/R103) * Ron * ID$$

The voltage V5 is supplied to the input terminal on the positive side of the comparator (CMP101) and the voltage (reference voltage) V4 obtained by dividing a voltage of the DC power supply VB through the resistors R101 and R102 is supplied to the input terminal on the negative side. When the voltage V5 is higher than the voltage V4, therefore, an output signal of the comparator (CMP101) is inverted. More specifically, when an overcurrent flows to the load 101 so that the current ID is increased, the voltage V5 is increased by the equation (2) and becomes higher than the voltage V4 so that an output signal of the comparator (CMP101) is inverted. By detecting the same signal to break the FET (T101), therefore, it is possible to protect the load 101 and a circuit to be connected thereto.

In the circuit, the ON-state resistance Ron is increased even if a load circuit is normal, and the voltage V5 is increased by the equation (2) so that V5>V4 is obtained and the output of the comparator (CMP101) is inverted from an L level to an H level for a transition period from an OFF state to an ON state of the FET (T101). Accordingly, an overcurrent detecting function cannot be achieved.

For this reason, there is provided a start timer 103 for starting synchronously with an output signal of the driver circuit 102 and an L level signal is output from the start timer 103 irrespective of the output of the comparator (CMP101) until the transition period of the FET (T101) is ended, and the L level output is used for determining an overcurrent. Thus, the transition period is prevented from being decided erroneously.

However, the related overcurrent detecting device has the following problems (1) and (2).

(1) A timer duration of the start timer 103 is set by previously estimating the transition period of the FET (T101). The transition period is not always equal but has a variation even if a unit having the same standards is used. For this reason, the timer duration should be set to be longer than a transition period having a maximum variation. In this case, if the FET (T101) having a shorter transition period than the set transition period is used, masking is carried out by the start timer 103 irrespective of the achievement of the overcurrent detecting function. As a result, there is generated a period for which the precious overcurrent detecting function cannot be used.

(2) When a type of the FET (T101) to be used as a semiconductor switch is changed, a gate capacity of the FET (T101) is varied so that the transition period is changed. Thus, the transition period is changed depending on a structure of a gate circuit or a gate characteristic of the FET. Correspondingly, a duration of the start timer 103 is to be set. With a structure in which the overcurrent detecting device is provided in an IC, it is necessary to add a regulating terminal for regulating the timer duration on the outside of the IC to an IC package and to add a regulating circuit to the outside of the IC. This causes an increase in a cost.

SUMMARY OF THE INVENTION

The invention has been made to solve such problems and has an object to provide an overcurrent detecting device capable of setting a proper mask duration for a transition period of a semiconductor switch also when the transition period is changed, and instantly operating an overcurrent detecting function when the transition period is ended.

In order to achieve the object, a first aspect of the invention is directed to an overcurrent detecting device for detecting an overcurrent in a load circuit for controlling ON/OFF of a load by using a semiconductor switch, comprising:

a driver circuit that outputs a driving signal to the semiconductor switch;

a reference voltage generating circuit that generates a reference voltage (V4);

a measured voltage generating circuit that generates a measured voltage (V5) corresponding to a voltage (VDS) generated across the semiconductor switch;

a first comparator that compares the measured voltage with the reference voltage and outputs an overcurrent determination signal when the measured voltage is greater than the reference voltage;

a saturation determining circuit that determines that a differential voltage (VG−V1) between a control voltage (VG) of the semiconductor switch and a voltage (V1) to be applied to a positive side of the semiconductor switch is greater than a predetermined voltage (δ); and an overcurrent signal switching circuit (AND1) that performs a switching operation so as to enable the overcurrent determination signal to be output to the driver circuit when the saturation determining circuit determines that the differential voltage (VG−V1) is greater than the predetermined voltage (δ).

Figure 1:
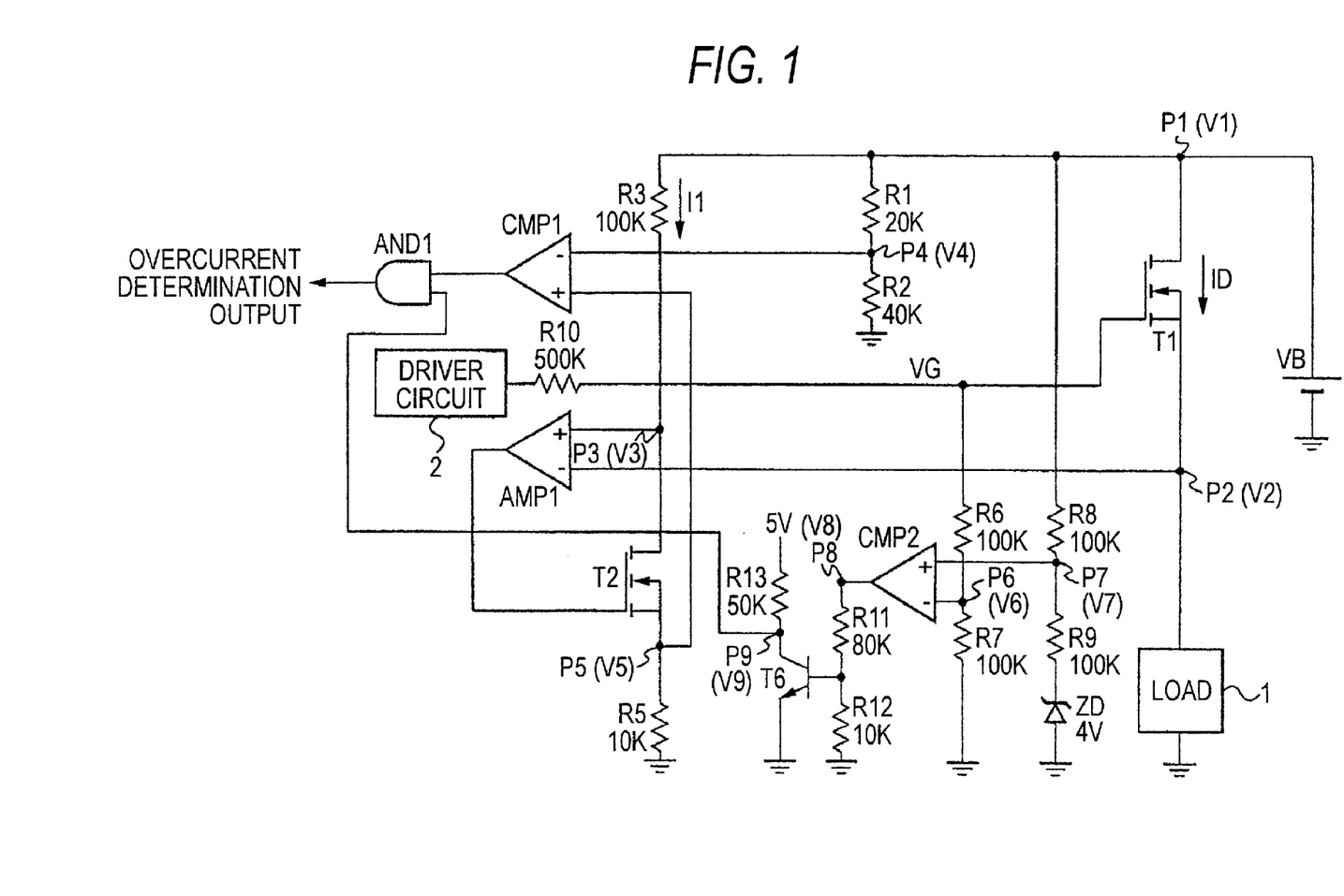
FIG. 1 is a circuit diagram showing a structure of an overcurrent detecting device according to a first embodiment of the invention.

A transition period of the circuit in FIG. 1, that is, a period required for turning ON a semiconductor switch (T1) to freely use an overcurrent detecting function includes a period required for saturating the voltage VDS between a drain and a source in the semiconductor switch (T1) and a period required for then adding a delay time until the measured voltage generating circuit is normally operated. A duration required for saturating the voltage VDS is detected by using the gate voltage of the semiconductor switch (T1) and the delay time of the measured voltage generating circuit is approximated by using comparator (CMP2) having the same characteristics as those of an amplifier AMP1. Thus, the transition period of the semiconductor switch (T1) is decided. Moreover, the overcurrent detecting function is operated immediately after the determination of the end of the transition period.

According to the above configuration, also in the case in which an individual variation is present for the transition period in which the semiconductor switch is changed over from OFF to ON, and furthermore, the structure and the gate characteristic of the gate circuit are varied, the detection and determination of an equal and proper transition period is always implemented. In addition, the transition period in the normal operation of the semiconductor switch is short, that is, several ☐secs. By a combination with an operational amplifier having an excellent responsiveness, therefore, an overcurrent is detected to break the circuit immediately after the end of the transition period also in the case in which a wiring abnormality such as a dead short-circuit is generated before a start. Consequently, it is possible to reliably protect the wiring and the semiconductor switch themselves.

According to the above configuration, moreover, the transition period is detected with high precision without a malfunction and the transition period from the ON operation of the semiconductor switch to the achievement of the overcurrent detecting function is set to be minimum. By only a method of detecting a voltage between terminals of the semiconductor switch, consequently, it is possible to implement an overcurrent protecting function, to simplify a structure of the circuit and to reduce a cost without using another device.

Preferably, the predetermined voltage is set to be a value which is equal to or greater than a threshold voltage (Vth1) of the semiconductor switch.

According to the above configuration, the predetermined voltage to be used for determining the differential voltage (VG−V1) between the control voltage (VG) of the semiconductor switch and the voltage (V1) to be applied to the positive side of the semiconductor switch is set to have a value which is equal to or greater than the threshold voltage (Vth1) of the semiconductor switch. Therefore, it is possible to operate the overcurrent detecting function after the semiconductor switch is reliably brought into a saturation state. Thus, it is possible to reliably avoid a malfunction caused by a rush current, and furthermore, to set a mask time to be short.

Preferably, the measured voltage generating circuit includes a first resistor (R3), an electronic switch (T2), a second resistor (R5) and an amplifier (AMP1). The amplifier (AMP1) controls a signal to be supplied to a control input terminal of the electronic switch so that a voltage generated on the first resistor is equal to the voltage (VDS) generated across the semiconductor switch. A voltage generated on the second resistor is set to be the measured voltage (V5). The saturation determining circuit includes a second comparator (CMP2) that determines whether or not the differential voltage (VG−V1) between the control voltage (VG) of the semiconductor switch and the voltage (V1) to be applied to the positive side of the semiconductor switch is greater than the predetermined voltage (δ). The second comparator is equal to or larger than the amplifier in the response characteristic. A switching signal is output to the overcurrent signal switching circuit when the second comparator determines that the differential voltage (VG−V1) is greater than the predetermined voltage (δ).

According to the above configuration, it is decided whether the differential voltage (VG−V1) between the voltage (VG) and the voltage (V1) is greater than the predetermined voltage by using the comparator (CMP2). Therefore, it is possible to reliably decide that the semiconductor switch is saturated.

In the case in which operational amplifiers having the same characteristic are used for the amplifying circuit (AMP1) and the comparator (CMP2), moreover, their delay times can be set to be equal and the overcurrent detecting function can be reliably operated after the semiconductor switch is saturated, and at the same time, the detection of the transient time can be executed in the shortest time.

Preferably, the voltage (VDS) generated across the semiconductor switch is set as the measured voltage. The saturation determining circuit includes a second comparator (CMP2) that determines whether or not the differential voltage (VG−V1) between the control voltage (VG) of the semiconductor switch and the voltage (V1) to be applied to the positive side of the semiconductor switch is greater than the predetermined voltage (δ). The second comparator (CMP2) is equal to or larger than the first comparator (CMP1) in the response characteristic. A switching signal is output to the overcurrent signal switching circuit when the second comparator determines that the differential voltage (VG−V1) is greater than the predetermined voltage (δ).

According to the above configuration, there is employed the structure in which the voltage (VDS) itself generated on the both ends of the semiconductor switch is supplied as a measured voltage to the first comparator. Therefore, it is possible to produce the same advantages as those of the overcurrent protecting device described in the first aspect of the invention, and furthermore, to simplify the structure of the circuit.

BRIEF DESCRIPTION OF THE DRAWINGS

The above objects and advantages of the present invention will become more apparent by describing in detail preferred exemplary embodiments thereof with reference to the accompanying drawings, wherein:

FIG. 2 is a characteristic chart showing a change in each voltage which is obtained after an FET (T1) is turned ON;

DETAILED DESCRIPTION OF THE PREFERRED EMBODIMENTS

An embodiment of the invention will be described below with reference to the drawings. FIG. 1 is a circuit diagram showing a structure of a load circuit for which an overcurrent detecting device according to an embodiment of the invention is employed. As shown in FIG. 1, the load circuit has a series connecting circuit including a DC power supply VB, an FET of an MOS type (T1; semiconductor switch) and a load 1 and turns ON/OFF the FET (T1), thereby controlling a driving operation of the load 1.

The DC power supply VB is a battery to be mounted on a vehicle, for example, and the load 1 is a motor for power window driving or various lamps which is/are to be mounted on the vehicle.

A gate of the FET (T1) is connected to a driver circuit 2 through a resistor R10, and the FET (T1) is turned ON/OFF in response to a driving signal output from the driver circuit 2. The gate voltage of the FET (T1) (a control voltage of the semiconductor switch) is represented as VG.

A point P1 (a voltage V1) to be an output terminal on a positive side of the DC power supply VB is grounded through a series connecting circuit including resistors R1 and R2, and a node P4 (a voltage V4; a reference voltage) of the resistors R1 and R2 is connected to an input terminal on a negative side of a comparator (CMP1; a comparing circuit).

Furthermore, the point P1 is grounded through a series connecting circuit including a resistor R3 (a first resistor), an FET (T2: an electronic switch) and a resistor R5 (a second resistor), and a node P3 (a voltage V3) of the resistor R3 and the FET (T2) is connected to an input terminal on a positive side of an amplifier (AMP1; an amplifying circuit).

Moreover, an input terminal on a negative side of the amplifier (AMP1) is connected to a point P2 (a voltage V2) to be a source of the FET(T1) and an output terminal of the amplifier (AMP1) is connected to a gate of the FET(T2). A point P5 (a voltage V5; a measured voltage) to be a source of the FET (T2) is connected to an input terminal on a positive side of the comparator (CMP1). An output terminal of the comparator (CMP1) is connected to one of input terminals of an AND circuit (AND1; an overcurrent signal switching circuit).

In addition, the point P1 is grounded through a series connecting circuit including resistors R8 and R9 and a Zener diode ZD. A gate of the FET (T1) is grounded through a series connecting circuit including resistors R6 and R7.

A connecting point P7 (a voltage V7) of the resistors R8 and R9 is connected to an input terminal on a positive side of a comparator (CMP2) and a node P6 (a voltage V6) of the resistors R6 and R7 is connected to an input terminal on a negative side of the comparator (CMP2). The comparator (CMP2) is constituted by an operational amplifier having the same characteristics as those of the amplifier (AMP1) or a unit having a slower response characteristic.

A point P8 (a voltage V8) to be an output terminal of the comparator (CMP2) is grounded through a series connecting circuit including resistors R11 and R12, and a node of the resistors R11 and R12 is connected to a base of a transistor (T6) and the transistor (T6) has an emitter grounded and a collector connected to a 5V power supply through a resistor 13. Furthermore, a point P9 (a voltage V9) to be a collector of the transistor (T6) is connected to the other input terminal of the AND circuit (AND1).

A numeric value described under each designation in the circuit, for example, "20 K" described under the resistor R1 indicates that an example of a resistance value of the resistor R is 20 KΩ.

Moreover, a reference voltage generating circuit is constituted by the resistors R1 and R2 shown in FIG. 1, a measured voltage generating circuit is constituted by the resistor R3, the FET (T2), the resistor R5 and the amplifier (AMP1), and a saturation determining circuit is constituted by the comparator (CMP2), the transistor (T6) and each of resistors connected thereto.

Next, description will be given to an operation of the overcurrent detecting device according to the embodiment which has the structure described above.

Each of the resistors is selected to set the resistors R6=R8 and the resistors R7=R9, the voltage of the point P6 to be the input terminal on the negative side of the comparator (CMP2) is represented as V6, the voltage of the point P7 to be the input terminal on the positive side is represented as V7, and furthermore, a Zener voltage of the Zener diode ZD is represented by Vzd. Moreover, the following equations (3) and (4) are established, wherein R7/(R6+R7)=R9/(R8+R9)=a and VG−V1=δ are set.

$$V6=VG*a=(V1+\delta)a \qquad (3)$$

$$V7=(V1-Vzd)a+Vzd \qquad (4)$$

When δ is calculated with V6=V7, the following equation (5) is obtained.

$$(V1+\delta)a=(V1-Vzd)a+Vzd$$

$$\delta=Vzd*(1-a)/a \qquad (5)$$

A value of δ with V6=V7, that is, in the inversion of the output signal of the comparator (CMP2) can be set to be an optional value by the Zener voltage Vzd and a. For example, when Vzd=4V and a=0.5 are set, δ=4V is obtained.

When the FET (T1) is OFF, VG is 0V because the output terminal of the driver circuit 2 is grounded. Accordingly, VG<V1 and V6<V7 are obtained so that a great voltage difference is generated on two input terminals of the comparator (CMP2) and the output signal of the comparator (CMP2) is raised to an upper limit voltage. At this time, a great voltage difference is also generated on the input terminal of the amplifier (AMP1) in the same manner and the output signal is raised to an upper limit voltage. Therefore, the relationship of the input/output between the amplifier (AMP1) and the comparator (CMP2) is set in a similar condition.

In the case in which the FET (T1) is an NMOS, the gate voltage VG is raised beyond the supply voltage V1 when the FET (T1) is turned ON. If a threshold voltage of the FET (T1) is represented by Vth1, a voltage VDS between the drain and the source in the FET (T1) is saturated when the following equation (6) is established.

$$VG > V1 + Vth1 \quad (6)$$

More specifically, whether the voltage VDS is saturated can be decided based on a difference between the gate voltage VG and the supply voltage V1. When the voltage VDS is saturated, and the wiring has no abnormality in which the overcurrent state is not brought, a voltage of the input terminal on the negative side of the amplifier (AMP1), that is, the voltage V2 of the point P2 is higher than a voltage of the input terminal on the positive side, that is, the voltage V3 of the point P3. Consequently, the output signal of the amplifier (AMP1) carries out a transition to an inversion and is started to be dropped while generating a response delay. On the other hand, when the equation (7) is established, the output signal of the comparator (CMP2) is inverted.

$$VG > V1 + \delta \quad (7)$$

When $Vth1 \leq \delta$ is set, a timing for starting to invert the output signal of the comparator (CMP2) can be set after the voltage VDS is completely saturated and transition from a high level to a low level on the output voltage of the amplifier (AMP1) is then finished.

When a difference between Vth1 and δ is set to be small, the output signal of the comparator (CMP2) is delayed slightly from the output signal of the amplifier (AMP1) and carries out a transition to the inversion in the same manner as the amplifier (AMP1), and is started to be dropped while generating a response delay.

The comparator (CMP2) is operated on the same input/output conditions by using an operational amplifier having the same characteristics as the amplifier (AMP1). Therefore, a response delay of the comparator (CMP2) is equal to that of the amplifier (AMP1). More specifically, the comparator (CMP2) approximates to the response delay of the amplifier (AMP1) with high precision.

When the voltage V8 of the output terminal P8 of the comparator (CMP2) is dropped, the transistor (T6) in an ON state is turned OFF.

The transition of the transistor (T6) from ON to OFF due to the output voltage of the comparator (CMP2) can be regulated by setting a resistance ratio of the resistors R11 and R12. If a timing for the transition of the transistor (T6) from ON to OFF is regulated to be set after the output of the amplifier (AMP1) completely converges on a value (m*VDS) determined by VDS and an amplification rate m (=R5/R3), that is, the response delay of the amplifier (AMP1) is eliminated, a timing for turning OFF the transistor (T6) can represent a time immediately after the saturation of the voltage VDS and the subsequent response delay of the amplifier (AMP1) are completed.

More specifically, a transition period before the overcurrent detecting function is started to be established can be detected with a minimum delay. The output of the AND circuit (AND1) has an L level and the output of the comparator (CMP1) is prohibited while the transistor (T6) is ON. When the transistor (T6) is turned OFF, however, the output signal of the comparator (CMP1), that is, the overcurrent detecting function is operated.

The description has been given to the case in which the FET (T1) is the NMOS. In case of a PMOS, a gate voltage VGp is equal to the source voltage V1 when the FET (T1) is set in the OFF state, and is dropped toward a ground level when the FET (T1) is turned ON. Therefore, it is possible to apply the same thinking way if the equations (6) and (7) are replaced with the following equations (8) and (9).

$$VGp < V1 - Vth1 \quad (8)$$

$$VGp < V1 - \delta \quad (9)$$

Figure 2:
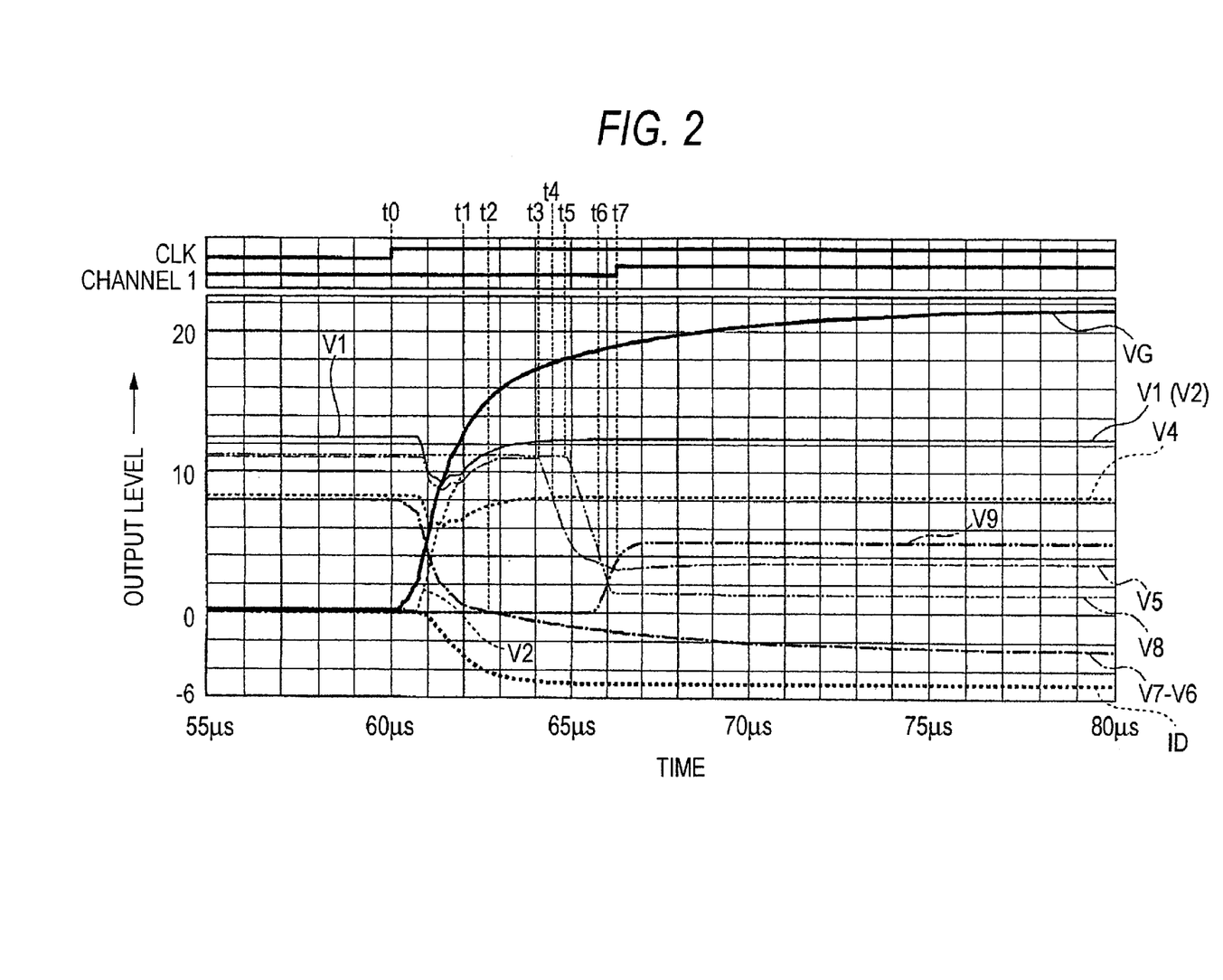

With reference to a characteristic chart of FIG. 2, next, description will be given to an operation to be carried out until the FET (T1) performs a transition from the OFF state to the ON state and a transition period is passed to reach a stable ON state. FIG. 2 shows a simulation result in the circuit shown in FIG. 1.

V1 to V9 and VG shown in FIG. 2 are voltages shown in FIG. 1 and are as follows.

V1: a drain voltage of the FET (T1) which is almost equal to the source voltage VB when an overcurrent does not flow V2: a source voltage of the FET (T1)

V3: a voltage on a coupling point of the resistor R3 and the drain of the FET (T2)

V4: a reference voltage in a determination of the overcurrent with a voltage obtained by dividing the voltage V1 through the resistors R1 and R2

V5: a voltage obtained by amplifying the voltage VDS between the drain and the source in the FET (T1) to be m times as high V6: a voltage of the input terminal on the negative side of the comparator (CMP2)

V7: a voltage of the input terminal on the positive side of the comparator (CMP2)

V8: an output voltage of the comparator (CMP2)

V9: a collector voltage of the transistor (T6)

VG: a gate voltage of the FET (T1)

ID: a drain current of the FET (T1)

In FIG. 2, moreover, a voltage waveform represents a positive voltage value in an upward direction with respect to an origin of an axis of ordinate and a unit is volt (V). On the other hand, the drain current ID represents a positive current value in a downward direction with respect to the origin of the axis of ordinate and a unit is ampere (A).

As shown in FIG. 2, the voltage V1 is equal to the source voltage of 12.5 V when the FET (T1) is set in the OFF state, and the voltage V5 is lower than the voltage V1 by a threshold voltage Vth2 of the FET (T2).

The voltage V4 is ⅔ of the voltage V1 because of R1=20 KΩ and R2=40 KΩ. The output terminal of the driver circuit 2 is grounded so that the voltage VG is almost 0V. Because of V7=(12.5−4)* 0.5+4=8.25 V and V6=0, V7−V6=8.25 V is set.

The voltage V8 is approximate to the source voltage because the output signal of the comparator (CMP2) has the H level, and V8≈V5 is set. The voltage V9 is 0V because the transistor (T6) is turned ON.

When the ON-state signal of the FET (T1) is input from an outside at a time of t=t0, the output signal of the driver circuit 2 is raised so that the gate voltage VG of the FET (T1) is raised. The FET (T1) is started to be turned ON by a rise in the voltage VG so that the drain current ID is started to flow.

The voltage V1 is dropped in proportion to a variation (dI/dt) of the drain current ID while the current is increased. The voltage V2 is raised while maintaining a relationship of V2=VG−Vth1, wherein the threshold voltage of the FET (T1) is represented by Vth1.

The FET (T1) is of an NMOS type having an ON-state resistance Ron=10 mΩ and a gate series resistance R10 is set to be 500 Ω. When the voltage V2 is raised so that V1≈V2 is set at t1, the voltage VDS between the drain and the source in the FET (T1) is brought into a saturation state so that the overcurrent detecting function using the voltage VDS can be operated.

Moreover, the amplifier (AMP1) controls a differential input voltage (V3−V2) to be zero in order to cause the voltage V5 to converge on V5=m*VDS. However, the amplifier (AMP1) has a response delay based on a Slew rate. For this reason, the convergence cannot be carried out immediately.

If the wiring has no abnormality, a target value of the voltage V5 is smaller than the reference voltage V4. The drop is started at a time of t3 and V5<V4 is set after a time of t4, and V5=m*VDS at a time of t6 is satisfied to reach a control target value. Then, a slight drop is carried out and a value which is excessively smaller than the target value is reached. However, the response delay of the amplifier (AMP1) is eliminated almost completely.

On the other hand, referring to the comparator (CMP2), V7−V6=0[V] and VG−V1=δ are set at a time of t2 so that the output signal of the comparator (CMP2) is started to be inverted. However, the comparator (CMP2) has a response delay which is equal to that of the amplifier (AMP1). For this reason, the drop is started at a time of t5. Since an inverting operation is carried out later than the amplifier (AMP1), however, t3<t5 is obtained.

At a time of t7, the transistor (T6) is changed from ON to OFF. At this time, the voltage V5 to be controlled by the amplifier (AMP1) has a response delay eliminated and is set into a normal control state. Since the prohibition of the output of the comparator (CMP1) is released with an OFF-state signal of the transistor (T6), that is, in a timing in which the voltage V9 is changed from 0V to 5V, accordingly, the overcurrent detecting function passes through a transition period to start a normal operation. Therefore, a malfunction is not caused.

Even if the converging characteristics of the VDS are changed depending on the individual variation of the FET or a change in a type of the FET, the end of the transition period is decided by the technique depending on the response delay of (VG−V1) and the operational amplifier (AMP1, CMP2). Therefore, proper setting is always carried out. More specifically, a timing for determining the end of the transition period is automatically corrected corresponding to the converging characteristic of the voltage VDS.

Figure 3:
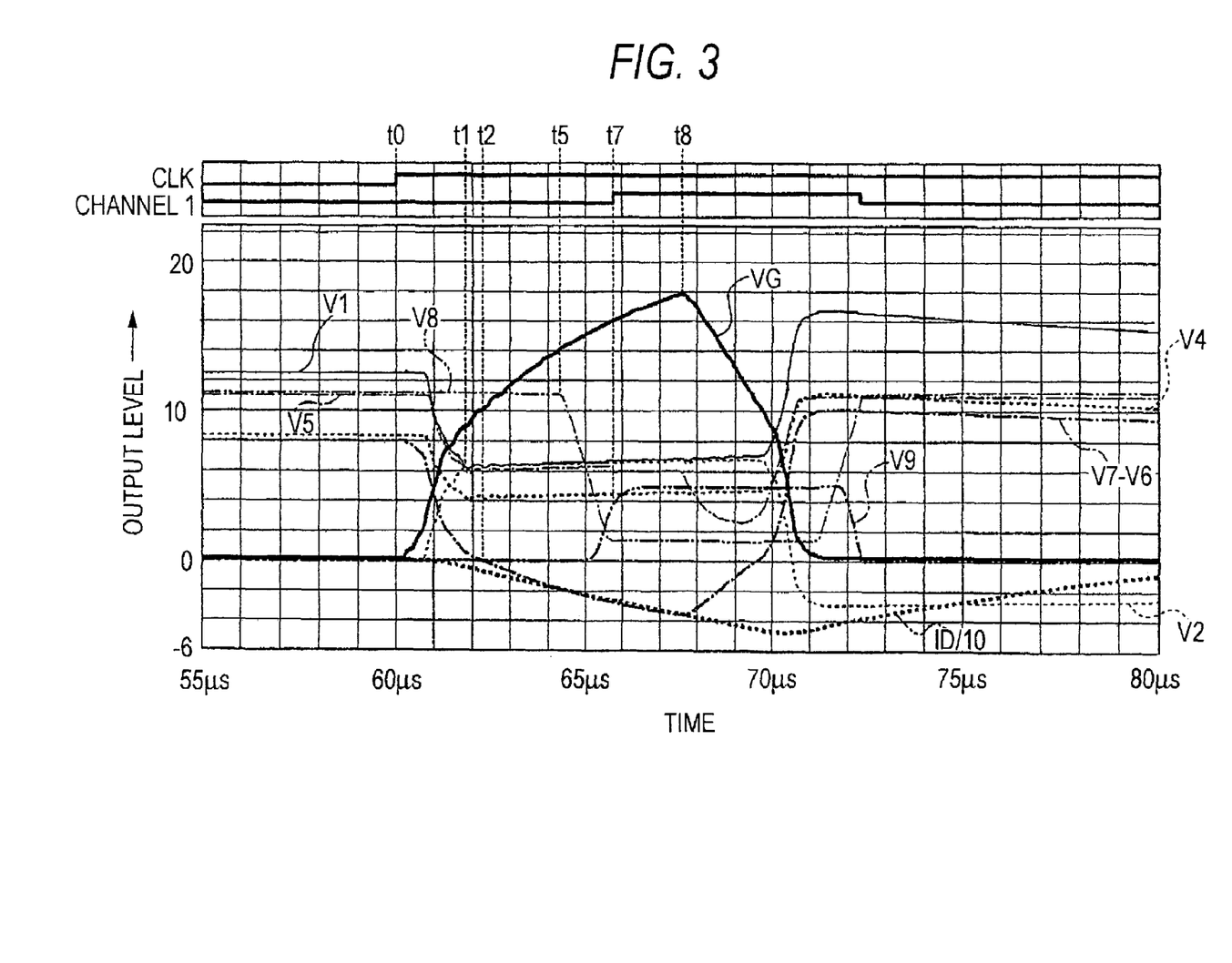
FIG. 3 is a characteristic chart showing a change in each voltage obtained after the FET (T1) is turned ON when a dead short-circuit is generated initially.

FIG. 3 shows a simulation waveform obtained in the case in which a dead short-circuit is generated initially, that is, when a start is carried out in an overcurrent state in which the source of the FET (T1) causes the dead short-circuit (grounded at 0.05 Ω) before the FET (T1) is turned ON. Voltages V1 to V9 and VG are identical to those in FIG. 2.

Since the current ID is larger than that in FIG. 2, it is shown in a 1/10 scale in FIG. 2. A peak of the current ID is close to 50 A.

When an ON-state signal is input from an outside at t=t0, the voltage VG is raised so that the current ID starts to flow. Since the current is increased rapidly, the voltage V1 is greatly dropped so that the voltages V4 and V5 are also dropped. The voltage V2 is raised to obtain V2≈V1 at a time of t1.

The voltage VDS is saturated so that the amplifier (AMP1) amplifies VDS. However, the current ID exceeds a normal current range. Therefore, a target value of the voltage V5 is greater than V4 and the voltage V5 is not dropped, and a signal output from the comparator (CMP1) maintains an H level. On the other hand, a signal output from the comparator (CMP2) carries out a transition to an inverting operation at a time of t2 and is started to be dropped at a time of t5, and the transistor (T6) carries out a transition from ON to OFF at a time of t7. As a result, both of the two input terminals of the AND circuit (AND1) are set to have the H level so that an H level signal is output from the AND circuit (AND1) and an overcurrent detecting output is generated. Consequently, the FET (T1) is broken at a time of t8.

A short-circuit current is cut off at approximately 7.6□s after the FET (T1) is turned ON. Also in the case in which a dead short-circuit is caused initially, a peak value of the short-circuit current is equal to or smaller than 50 A so that the wiring and the FET (T1) can be protected reliably. This is an advantage obtained by bringing a timing for starting an operation of an overcurrent detecting function to be close to a start point.

In the embodiment, thus, the signal output from the comparator (CMP2) is set to be inverted immediately after the voltage VDS between the drain and the source in the FET (T1) is saturated, and the voltage V9 to be input to one of the input terminals of the AND circuit (AND1) is set to have the H level in response to an inversion signal of the comparator (CMP2) so that the signal output from the comparator (CMP1) for outputting an overcurrent determination signal functions. Therefore, a mask time for switching the FET (T1) from OFF to ON can be set to be the shortest.

Also in the case in which a variation is generated on the FET (T1), therefore, it is possible to always set the shortest mask time corresponding to the FET (T1). Consequently, it is possible to break the FET (T1), thereby protecting the circuit instantly when the overcurrent is generated.

Figure 4:
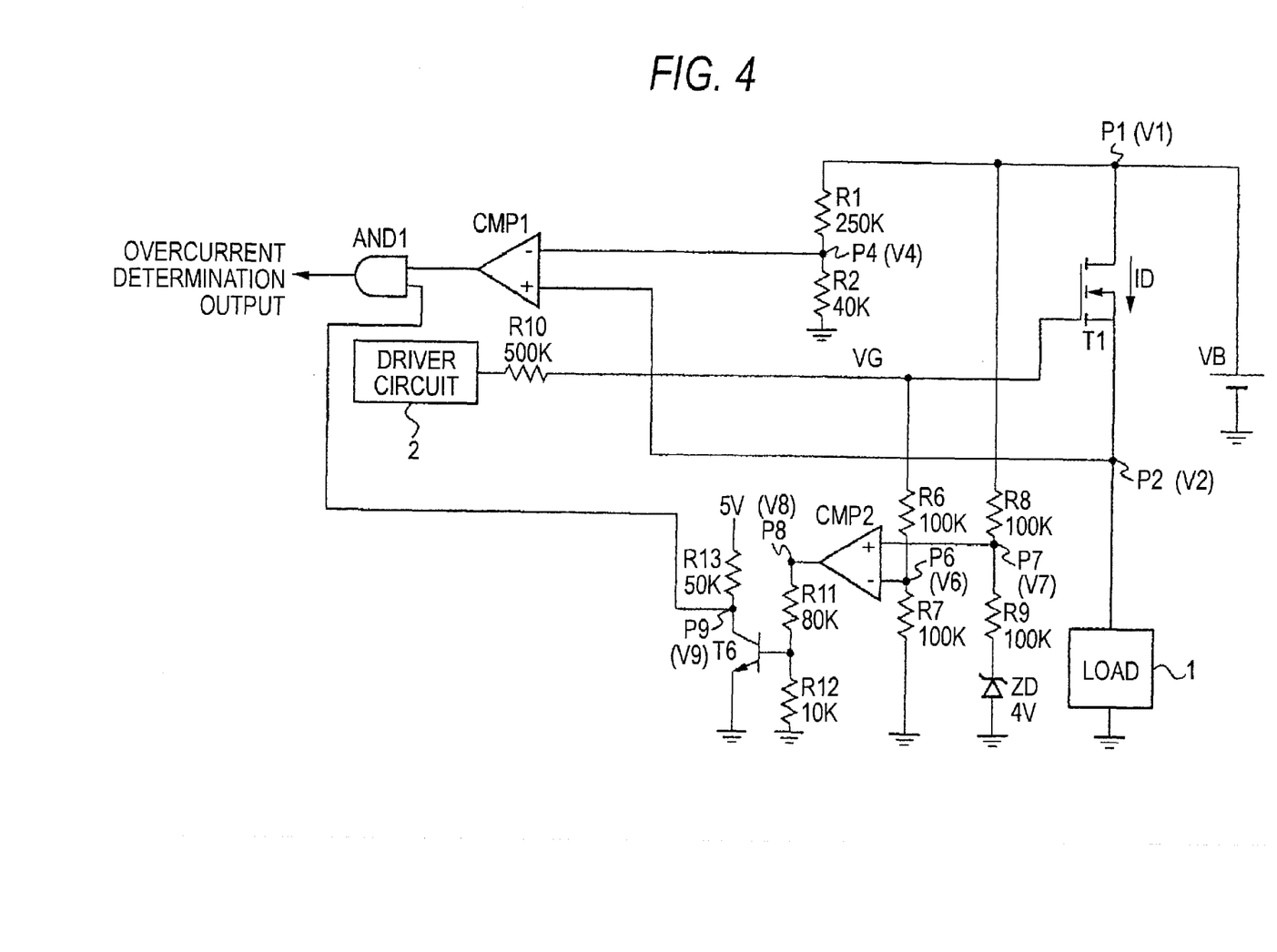
FIG. 4 is a circuit diagram showing a structure of an overcurrent detecting device according to a second embodiment of the invention.

Next, description will be given to a second embodiment of the invention. FIG. 4 is a circuit diagram showing a structure of an overcurrent detecting device according to the second embodiment. In the embodiment, the amplifying circuits (AMP1, T2, R3, R5) are removed from the overcurrent detecting device shown in FIG. 1 and there is constituted an overcurrent detecting circuit of such a type as to directly compare a voltage VDS (=V1−V2) between a drain and a source in an FET (T1) with an overcurrent determination voltage.

If a voltage obtained by dividing the voltage V1 through resistors R1 and R2 is represented by V4, an overcurrent determination voltage is set to be (V1−V4). It is necessary to set resistance values of R1 and R2 in such a manner that (V1−V4) approximates to 100 mV. Therefore, a voltage dividing ratio obtained by the resistors R1 and R2 is different from that in the circuit shown in FIG. 1. The voltage V4 is input to an input terminal on a positive side of a comparator (CMP1) and a source voltage V2 of the FET (T1) is input to an input terminal on a negative side.

When a drain current ID of the FET (T1) is set in a normal range, VDS<(V1−V4) is set so that an output of the comparator (CMP1) is set to have an L level. For the comparator (CMP1), a normal comparator or operational amplifier is used.

Moreover, a circuit for comparing a control terminal voltage (VG) of the FET (T1) with the source voltage (V1) has the same structure as that in FIG. 1. For a comparator (CMP2), the same unit as the comparator (CMP1) or a unit having a slower response characteristic than that in the comparator (CMP1) is used. The other operations related to a transition period detection are the same as those in FIG. 1.

While the overcurrent detecting device according to the invention has been described above based on the embodiment shown in the drawing, the invention is not restricted thereto but a structure of each portion can be replaced with an optional structure having the same function.

Although the description has been given by taking, as an example, the case in which an FET of an MOS type is used as a semiconductor switch in the embodiment, the invention is not restricted thereto but other semiconductor switches can be used.

The invention is very useful for setting a mask time for turning ON a semiconductor switch to be the shortest.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2005-044398 filed on Feb. 21, 2005, the contents of which are incorporated herein for reference.

What is claimed is:

1. An overcurrent detecting device for detecting an overcurrent in a load circuit for controlling ON/OFF of a load by using a semiconductor switch, comprising:
 a driver circuit that outputs a driving signal to the semiconductor switch;
 a reference voltage generating circuit that generates a reference voltage;
 a measured voltage generating circuit that generates a measured voltage corresponding to a voltage generated across the semiconductor switch;
 a first comparator that compares the measured voltage with the reference voltage and outputs an overcurrent determination signal when the measured voltage is greater than the reference voltage;
 a saturation determining circuit that determines that a differential voltage between a control voltage of the semiconductor switch and a voltage to be applied to a positive side of the semiconductor switch is greater than a predetermined voltage; and
 an overcurrent signal switching circuit that performs a switching operation so as to enable the overcurrent determination signal to be output to the driver circuit when the saturation determining circuit determines that the differential voltage is greater than the predetermined voltage.

2. The overcurrent detecting device according to claim 1, wherein the predetermined voltage is set to be a value which is equal to or greater than a threshold voltage of the semiconductor switch.

3. The overcurrent detecting device according to claim 1, wherein the measured voltage generating circuit includes a first resistor, an electronic switch, a second resistor and an amplifier;
 wherein the amplifier controls a signal to be supplied to a control input terminal of the electronic switch so that a voltage generated on the first resistor is equal to the voltage generated across the semiconductor switch;
 wherein a voltage generated on the second resistor is set to be the measured voltage;
 wherein the saturation determining circuit includes a second comparator that determines whether or not the differential voltage between the control voltage of the semiconductor switch and the voltage to be applied to the positive side of the semiconductor switch is greater than the predetermined voltage;
 wherein the second comparator is equal to or larger than the amplifier in the response characteristic; and
 wherein a switching signal is output to the overcurrent signal switching circuit when the second comparator determines that the differential voltage is greater than the predetermined voltage.

4. The overcurrent detecting device according to claim 1, wherein the voltage generated across the semiconductor switch is set as the measured voltage;
 wherein the saturation determining circuit includes a second comparator that determines whether or not the differential voltage between the control voltage of the semiconductor switch and the voltage to be applied to the positive side of the semiconductor switch is greater than the predetermined voltage;
 wherein the second comparator is equal to or larger than the first comparator in the response characteristic; and
 wherein a switching signal is output to the overcurrent signal switching circuit when the second comparator determines that the differential voltage is greater than the predetermined voltage.

* * * * *